(12) United States Patent
Kanno

(10) Patent No.: US 9,425,372 B2
(45) Date of Patent: Aug. 23, 2016

(54) LED DEVICE, METHOD OF MANUFACTURING THE SAME, AND LIGHT-EMITTING APPARATUS

(75) Inventor: Hideyuki Kanno, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 195 days.

(21) Appl. No.: 13/521,294

(22) PCT Filed: Jan. 18, 2011

(86) PCT No.: PCT/JP2011/050756
§ 371 (c)(1),
(2), (4) Date: Jul. 10, 2012

(87) PCT Pub. No.: WO2011/093174
PCT Pub. Date: Aug. 4, 2011

(65) Prior Publication Data
US 2012/0292660 A1 Nov. 22, 2012

(30) Foreign Application Priority Data
Jan. 29, 2010 (JP) ................ 2010-018719

(51) Int. Cl.
*H01L 29/06* (2006.01)
*H01L 21/44* (2006.01)
(Continued)

(52) U.S. Cl.
CPC .............. *H01L 33/647* (2013.01); *H05K 3/32* (2013.01); *F21K 9/90* (2013.01); *F21V 7/05* (2013.01); *F21V 17/12* (2013.01); *F21Y 2101/02* (2013.01); *F21Y 2103/022* (2013.01); *F21Y 2105/001* (2013.01); *H01L 25/0753* (2013.01); *H01L 33/486* (2013.01); *H01L 33/62* (2013.01); *H01L 2224/48091* (2013.01); *H01L 2224/48137* (2013.01); *H01L 2924/01322* (2013.01); *H05K 1/0203* (2013.01); *H05K 3/301* (2013.01);
(Continued)

(58) Field of Classification Search
CPC ................ H01L 2224/48091; H01L 2924/00; H01L 2924/01322; H01L 2924/00014; H01L 2224/48137; H01L 25/0753; H01L 33/486; H01L 33/62; H01L 33/647
USPC .......... 257/675, E33.065, E33.066, E33.075, 257/13, 79–103; 438/14, 106, 107, 122
See application file for complete search history.

(56) References Cited

U.S. PATENT DOCUMENTS 5,404,282 A 4/1995 Klinke et al.
6,274,924 B1 * 8/2001 Carey et al. .................. 257/676
(Continued)

FOREIGN PATENT DOCUMENTS

CN 1526169 A 9/2004
CN 101582419 A 11/2009
(Continued)

OTHER PUBLICATIONS

International Search Report of PCT/JP2011/050756, date of mailing Mar. 22, 2011.
(Continued)

*Primary Examiner* — H Tsai
(74) *Attorney, Agent, or Firm* — Collard & Roe, P.C.

(57) ABSTRACT

The LED device (27) has a LED bare chip (25) mounted directly on a metal contact (28), and supplies power to the bare chip and conducts heat from the bare chip via the metal contact.

17 Claims, 19 Drawing Sheets

(51) Int. Cl.
    *H01L 33/64*     (2010.01)
    *H05K 3/32*     (2006.01)
    *H01L 25/075*     (2006.01)
    *H01L 33/48*     (2010.01)
    *H01L 33/62*     (2010.01)
    *H05K 1/02*     (2006.01)
    *H05K 3/30*     (2006.01)
    *F21K 99/00*     (2016.01)
    *F21V 7/05*     (2006.01)
    *F21V 17/12*     (2006.01)
    *F21Y 101/02*     (2006.01)
    *F21Y 103/02*     (2006.01)
    *F21Y 105/00*     (2016.01)

(52) U.S. Cl.
    CPC .............. *H05K2201/1031* (2013.01); *H05K 2201/10189* (2013.01); *H05K 2201/10409* (2013.01); *H05K 2201/10962* (2013.01); *Y02P 70/611* (2015.11)

(56) References Cited

U.S. PATENT DOCUMENTS

| | | |
|---|---|---|
| 7,400,029 B2 | 7/2008 | Shimada et al. |
| 7,626,250 B2 | 12/2009 | Lee et al. |
| 7,772,610 B2 | 8/2010 | Wang |
| 7,855,395 B2 | 12/2010 | Lee et al. |
| 7,939,848 B2 | 5/2011 | Kim et al. |
| 8,288,793 B2 | 10/2012 | Kim et al. |
| 2001/0026011 A1 | 10/2001 | Roberts et al. |
| 2002/0113244 A1 | 8/2002 | Barnett et al. |
| 2003/0151343 A1 | 8/2003 | Jeganathan et al. |
| 2003/0218417 A1 | 11/2003 | Chin |
| 2005/0199900 A1 | 9/2005 | Lin et al. |
| 2005/0236639 A1* | 10/2005 | Abe et al. ................ 257/100 |
| 2006/0012299 A1* | 1/2006 | Suehiro et al. ............ 313/512 |
| 2006/0043401 A1 | 3/2006 | Lee et al. |
| 2007/0025103 A1 | 2/2007 | Chan |
| 2007/0080357 A1* | 4/2007 | Ishii ............................ 257/98 |
| 2008/0042151 A1 | 2/2008 | Oh et al. |
| 2008/0296590 A1 | 12/2008 | Ng |
| 2009/0001393 A1 | 1/2009 | Seo et al. |
| 2009/0045430 A1* | 2/2009 | Seo et al. ...................... 257/99 |
| 2009/0230421 A1 | 9/2009 | Su |
| 2009/0283781 A1 | 11/2009 | Chan et al. |

FOREIGN PATENT DOCUMENTS

| | | |
|---|---|---|
| DE | 20 2007 012 162 U1 | 4/2008 |
| EP | 1 002 696 A2 | 5/2000 |
| JP | 61-171089 U | 10/1986 |
| JP | H08-116096 A | 5/1996 |
| JP | 2003 303936 A | 10/2003 |
| JP | 2004-199896 | 7/2004 |
| JP | 2006-165097 | 6/2006 |
| JP | 2006-165101 | 6/2006 |
| JP | 2006-339653 | 12/2006 |
| JP | 2006-351351 A | 12/2006 |
| JP | 2007-80878 | 3/2007 |
| JP | 2008-512867 | 4/2008 |
| JP | 2008-270733 | 11/2008 |
| JP | 2008-300553 | 12/2008 |
| JP | 2009-267292 A | 11/2009 |
| JP | 2009-283472 A | 12/2009 |
| WO | 02/103794 A1 | 12/2002 |

OTHER PUBLICATIONS

Supplementary European Search Report in EP 11 73 6889, dated Aug. 14, 2013.
Chinese Office Action in CN 201180006903.5, dated Aug. 5, 2014.
Supplemental European Search Report in EP 14 18 0822, dated Mar. 3, 2015.
Japanese Office Action in 2011-551810, dated Nov. 26, 2014, with English translation of relevant parts.
English translation of the relevant part of the Japanese Office Action in 2011-551810, mailed on Mar. 4, 2015.
European Office Action dated Jul. 21, 2015 in European Application No. 11 736 889.4.
European Office Action dated Feb. 4, 2016 in European Application No. 11 736 889.4.

* cited by examiner

LED DEVICE, METHOD OF MANUFACTURING THE SAME, AND LIGHT-EMITTING APPARATUS

CROSS REFERENCE TO RELATED APPLICATIONS

This application is the National Stage of PCT/JP2011/050756 filed on Jan. 18, 2011, which claims priority under 35 U.S.C. §119 of Japan Application No. 2010-018719 filed on Jan. 29, 2010, the disclosure of which is incorporated by reference. The international application under PCT article 21(2) was not published in English.

TECHNICAL FIELD

This invention relates to a device (hereinafter referred to as an "LED device") using a light-emitting diode (hereinafter referred to as "LED") bare chip, a method of manufacturing the LED device, and a light-emitting apparatus using the LED device.

BACKGROUND ART

In recent years, the increase in LED output has been achieved. Following it, LED devices using LED bare chips being semiconductor components have been used also in general illumination, car headlamps, and so on which require large quantities of light. However, since the LED device also consumes large power for obtaining a large quantity of light, there has arisen a problem of heat generation which occurs as a result of the large power consumption. That is, since the LED bare chip is weak against heat, it is necessary to effectively dissipate the heat particularly from the bare chip.

JP-A-2004-199896 (Patent Document 1) discloses an LED illumination system which is increased in heat dissipation. This LED illumination system will be briefly described with reference to FIG. 24. A heat transfer layer 2 made of diamond is provided on a substrate 1, a conductive layer 3 having predetermined patterns is formed on the heat transfer layer 2, LED chips 4 are placed at predetermined positions on the conductive layer 3, electrodes 7 and 8 of the LED chips 4 are electrically connected to terminals 5 and 6 of the conductive layer 3, and lower surfaces of the LED chips 4 are in contact with heat contact portions 9 of the conductive layer 3, thereby enhancing heat dissipation.

PRIOR ART DOCUMENT

Patent Document

Patent Document 1: JP-A-2004-199896

SUMMARY OF THE INVENTION

Problem to be Solved by the Invention

However, with the structure in which the heat transfer layer made of diamond is provided on the substrate as in Patent Document 1, the substrate itself becomes expensive. Besides, since it is necessary to provide the wiring on the heat transfer layer, this also causes a further increase in cost.

Further, since the substrate provided with the heat transfer layer is essential, if the LED chips are mounted on a substrate having no heat transfer layer, the cooling effect of the LED chips cannot be expected. Consequently, the LED chip attaching object is limited in terms of heat dissipation.

It is therefore an object of this invention to provide an LED device that solves the above-mentioned problems.

Means for Solving the Problem

According to an aspect of the present invention, there is provided an LED device characterized in that an LED bare chip is mounted directly on a metal contact and power supply to the bare chip and heat conduction from the bare chip are carried out through the metal contact.

According to another aspect of the present invention, there is provided a method of manufacturing the above-mentioned LED device, characterized by preparing a lead frame formed with a pair of metal contacts, forming a device body by insert-molding the pair of metal contacts with the plastic, mounting the bare chips on the pair of metal contacts to form the LED device on the lead frame, and then cutting the metal contacts to separate the LED device from the lead frame.

According to still another aspect of the present invention, there is provided a light-emitting apparatus characterized by comprising the above-mentioned LED device and a connector adapted to be attached to an attaching object and capable of fitting the metal contacts, wherein power is supplied to the bare chips from the attaching object through the connector and the metal contacts and heat of the bare chips is transmitted to the attaching object through the metal contacts and the connector to carry out heat dissipation.

Effect of the Invention

According to this invention, it is possible to provide an LED device of a simple structure that is excellent in heat dissipation of an LED chip and that improves the cause of high cost, and a light-emitting apparatus using such an LED device.

MODE FOR CARRYING OUT THE INVENTION

Figure 1:
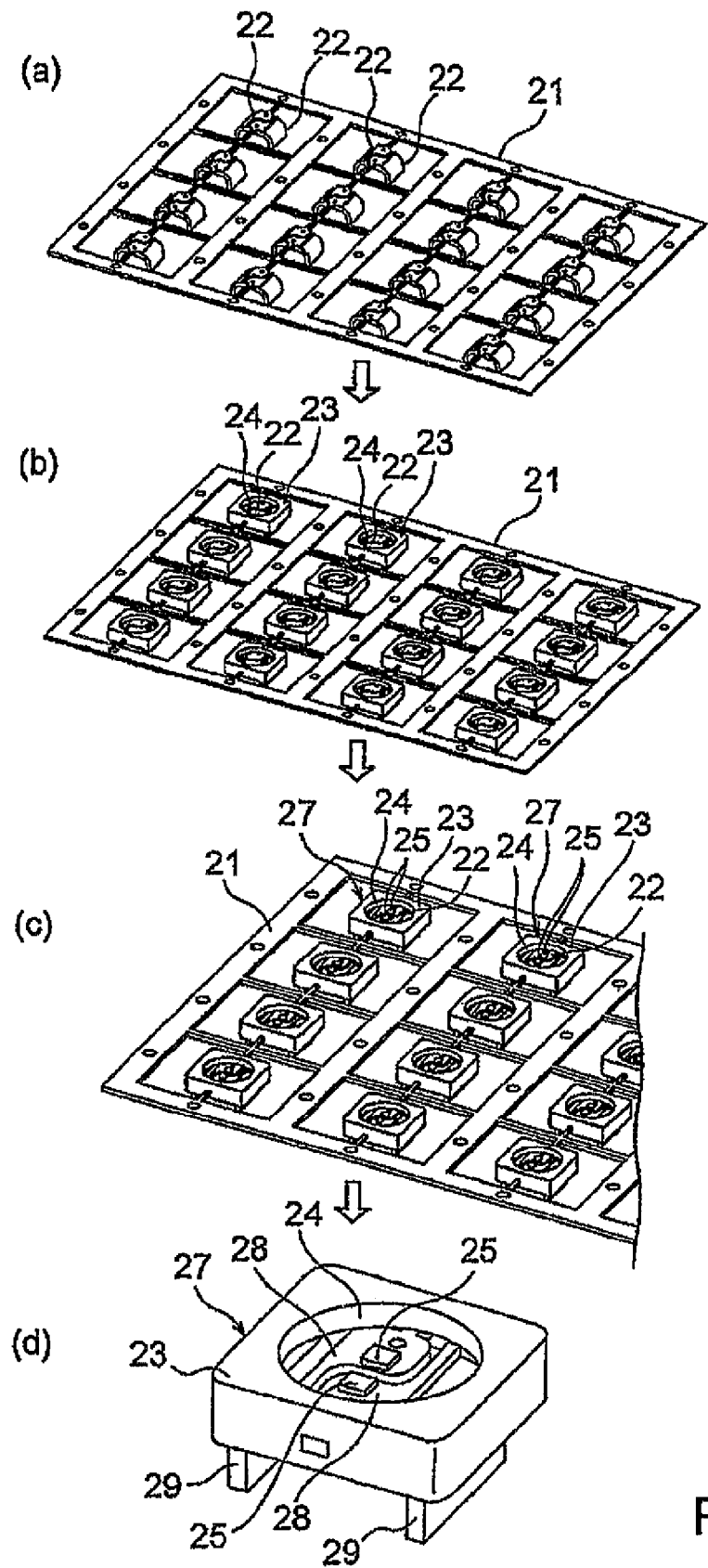
FIG. 1 is a process explanatory diagram for explaining a method of manufacturing LED devices according to an embodiment of this invention.

Referring first to FIG. 1, a description will be given of a method of manufacturing LED devices according to an embodiment of this invention.

In the manufacture of the LED devices, a metal lead frame 21 having a shape shown in FIG. 1(a) is prepared. The lead frame 21 is integrally formed with a number of metal pieces 22 of a predetermined shape which will be metal contacts in a later process. The metal pieces 22 respectively form pairs which are arranged in a matrix on the lead frame 21.

Proceeding to FIG. 1(b), engineering plastic is molded or insert-molded for each pair of the metal pieces 22, thereby forming a device body 23 of a predetermined shape which partially covers the metal pieces 22. In this event, a recess 24 is formed in an upper surface of the device body 23 so that end portions of the paired metal pieces 22 are exposed at positions adjacent to each other at the bottom of the recess 24.

Proceeding to FIG. 1(c), two LED bare chips (light-emitting elements) 25 are fixedly mounted in the recess 24 of each device body 23 by Au—Sn eutectic soldering or the like. In this event, the single bare chip 25 is placed in contact with the end portion of each metal piece 22 and, further, later-described conductive wires are electrically connected between the metal pieces 22 and the bare chips 25 and between the bare chips 25, respectively. In this manner, a number of LED devices 27 are formed on the lead frame 21.

Thereafter, portions, coupled to the lead frame 21, of the metal pieces 22 are cut, thereby separating the LED devices 27 from the lead frame 21. In this manner, the LED devices 27, one of which is shown in FIG. 1(d), can be relatively easily manufactured in large number. Finally, resin is filled into the recesses 24 of the device bodies 23 and cured.

Herein, referring particularly to FIG. 1(d), the manufactured LED device 27 will be described.

The LED device 27 includes a pair of metal contacts 28 formed by the metal pieces 22 shown in FIG. 1(a). While the metal contacts 28 are insert-molded to the device body 23, each metal contact 28 has one end exposed in the recess 24 of the device body 23 and the other end protruding downward from a lower surface of the device body 23 so as to form a plate-shaped terminal portion 29.

In the LED device 27, the bare chips 25 are placed in direct contact with the metal contacts 28, respectively. Accordingly, it is configured that power supply to the bare chips 25 and heat conduction from the bare chips 25 are carried out through the metal contacts 28. Further, since the LED device 27 has the pair of metal contacts 28 and the bare chip 25 is mounted, in equal number, on each of the paired metal contacts 28, the heat conduction from the bare chips 25 are uniformly dispersed to the paired metal contacts 28 and therefore excellent heat dissipation can be expected.

As described above, since the metal contacts 28 are each used to conduct both heat and electricity, it is possible to provide the LED device which is simple in structure and inexpensive.

Figure 2:
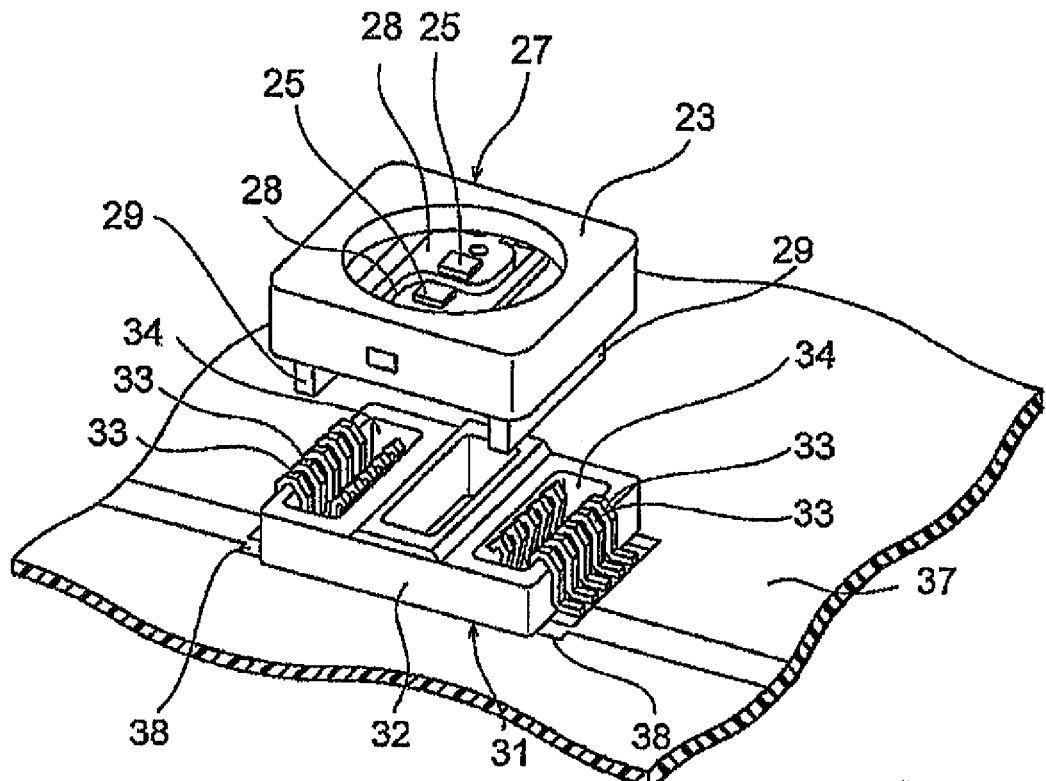
FIG. 2 is an exploded view of a light-emitting apparatus including the LED device shown in FIG. 1 (*d*) and a socket connector for connecting it.
Figure 3:
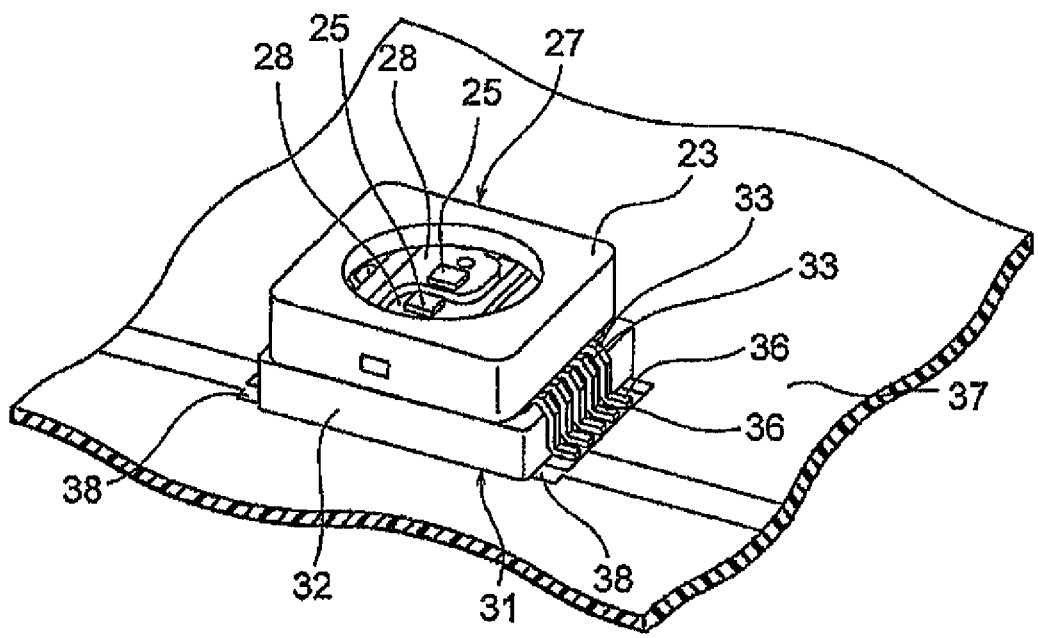
FIG. 3 is an assembled view of the light-emitting apparatus shown in FIG. 2.
Figure 4:
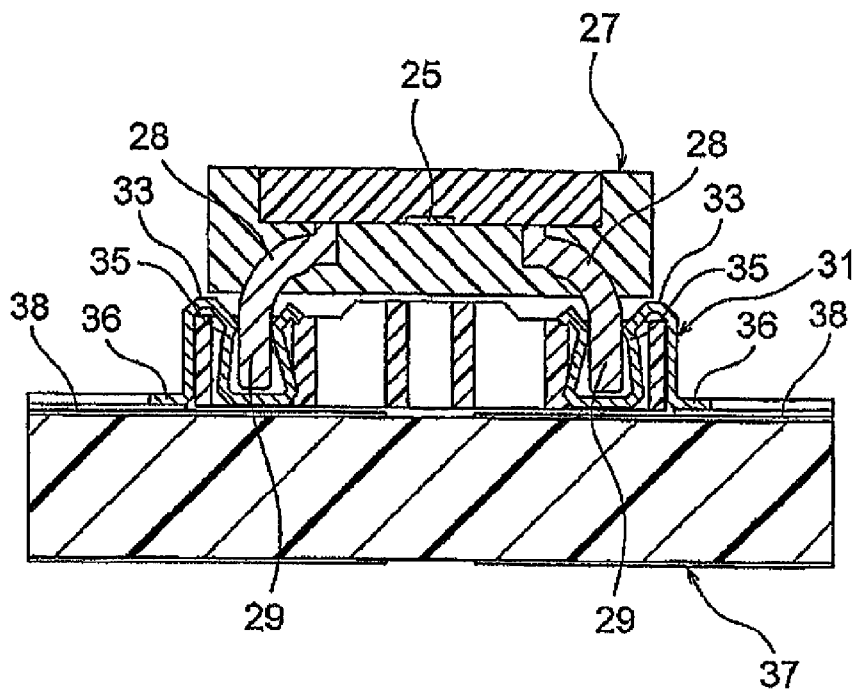
FIG. 4 is a cross-sectional view of FIG. 3.

Referring next to FIGS. 2 to 4, a description will be given of a light-emitting apparatus using the LED device 27 shown in FIG. 1(d).

This light-emitting apparatus comprises the LED device 27 and a socket connector 31 which is capable of fitting and releasing the LED device 27. The socket connector 31 comprises an insulating housing 32 made of plastic or the like and a number of metal springs 33 made of a material with a high thermal conductivity and attached to the housing 32. The housing 32 has two elongated holes 34 that respectively receive therein the two terminal portions 29 of the LED device 27.

The metal springs 33 are provided in plurality, for example, in the number of five, corresponding to each elongated hole 34 of the housing 32 and are arranged at intervals in the longitudinal direction of each elongated hole 34. Each metal spring 33 has a contact portion 35 disposed in the elongated hole 34 and a connecting portion 36 led out from the contact portion 35 to the outside of the housing 32. The connecting portions 36 are divided so as to correspond to one or the other of the two elongated holes 34 and are respectively connected to two interconnections 38, which are formed on an attaching object 37 such as a board, using a technique such as reflow soldering. In this manner, the socket connector 31 can be surface-mounted on the attaching object 37.

When the LED device 27 is fitted to the socket connector 31, the terminal portions 29 of the metal contacts 28 are inserted into the elongated holes 34 so as to be brought into contact with the plurality of contact portions 35 in a lump which are disposed therein. As a result, heats separately transmitted to the two metal contacts 28 from the two bare chips 25 are respectively dispersed to the plurality of metal springs 33 and further transmitted to the attaching object 37 through the connecting portions 36. Accordingly, excellent heat dissipation can be expected. Simultaneously, there are formed electrical paths each of which reaches the bare chip 25 from the interconnection 38 of the attaching object 37 through the metal springs 33 and the metal contact 28. Accordingly, it is possible to supply power to each bare chip 25 through the metal springs 33 and the metal contact 28.

According to this light-emitting apparatus, since the socket connector 31 can be mounted on the attaching object 37 in the state where the LED device 27 is not fitted, it is possible to prevent heat damage to the LED device 27 due to the reflow soldering and to prevent connection failure of the LED device 27 due to the occurrence of solder cracks after the mounting. Further, since the socket connector 31 which is capable of fitting and releasing the LED device 27 is used, it is possible to easily replace the LED device 27. Further, since contraction due to the difference in linear expansion coefficient between the LED device 27 and the solder is relaxed by spring contacts of the metal springs 33, a highly reliable connection function is achieved.

Figure 5:
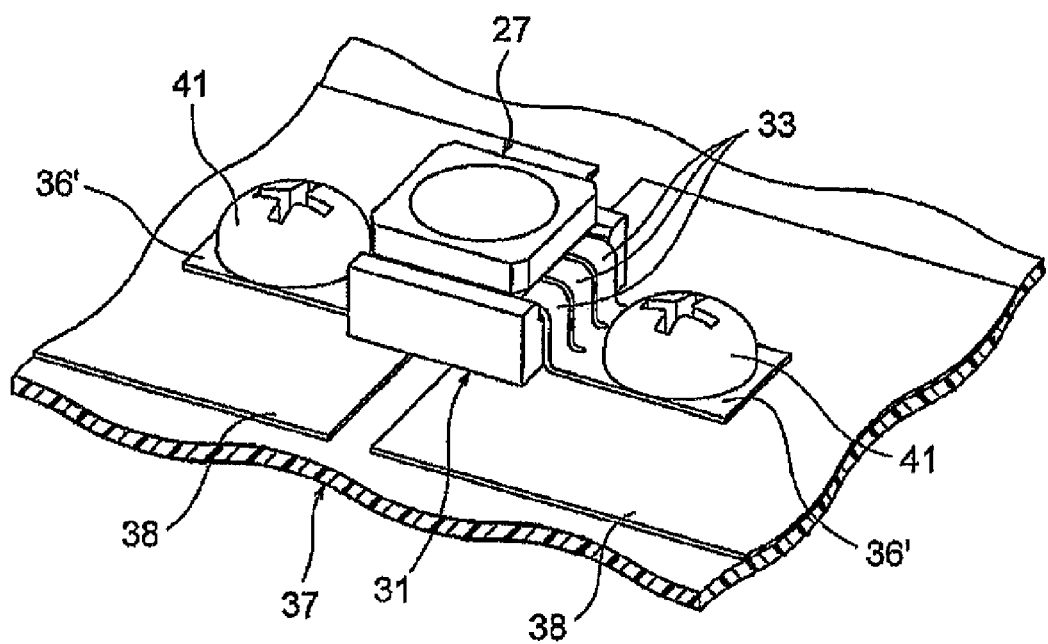
FIG. 5 is a perspective view showing another example of the mounting structure of a socket connector along with the LED device.
Figure 6:
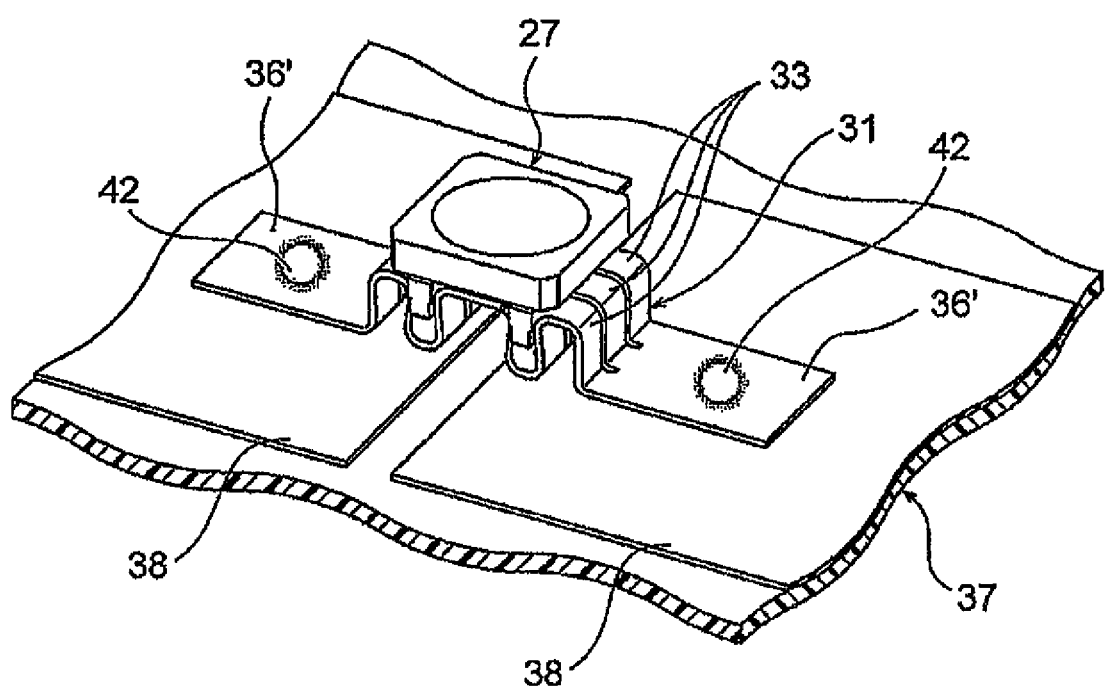
FIG. 6 is a perspective view showing still another example of the mounting structure of a socket connector along with the LED device.
Figure 7:
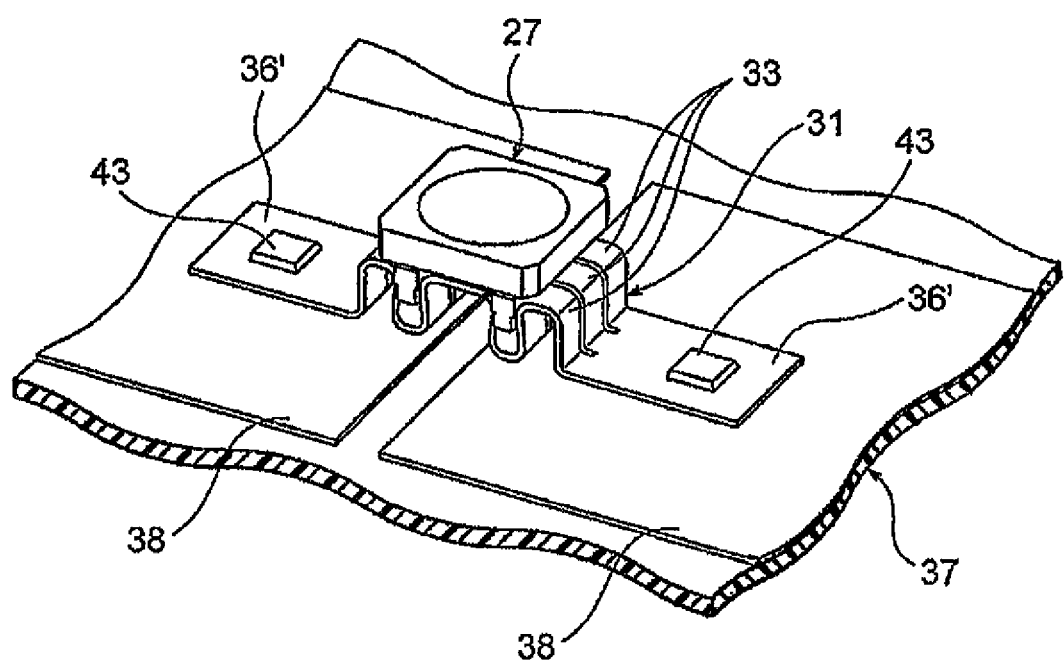
FIG. 7 is a perspective view showing still another example of the mounting structure of a socket connector along with the LED device.

While the description has been given above of the example in which the socket connector 31 is mounted on the attaching object 37 by connecting the plurality of connecting portions 36 to the interconnections 38, the socket connector 31 can also be mounted on the attaching object 37 by each of the structures shown in FIGS. 5 to 7.

In FIG. 5, connecting portions respectively provided to a plurality of metal springs 33 of a socket connector 31 are integrally formed together in advance, thereby obtaining a single connection plate 36'. Then, the connection plates 36' are fixed to an attaching object 37 by tightening screws 41, thereby electrically connecting the connection plates 36' to interconnections 38 on the attaching object 37.

In FIG. 6, connecting portions respectively provided to a plurality of metal springs 33 of a socket connector 31 are integrally formed together in advance, thereby obtaining a single connection plate 36'. Consequently, the socket connector 31 is formed without using the above-mentioned housing 32. Then, the connection plates 36' are fixed to an attaching object 37 using socket welding 42, thereby electrically connecting the connection plates 36' to interconnections 38 on the attaching object 37.

Figure 6A:
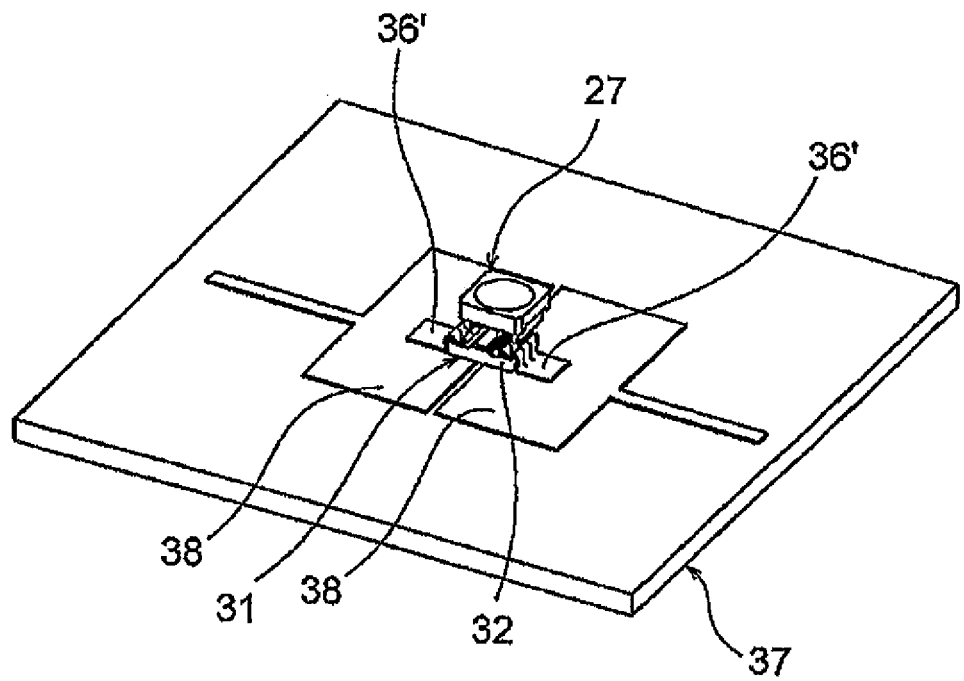
FIG. 6A is an exploded perspective view showing a modification of the socket connector shown in FIG. 6, along with the LED device and an attaching object.
Figure 6B:
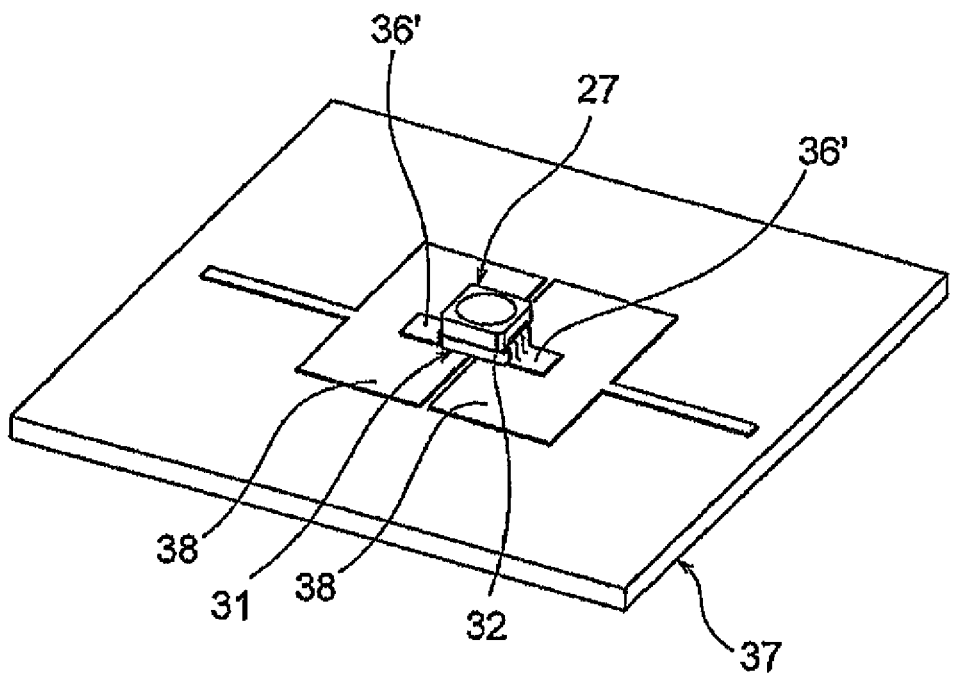
FIG. 6B is an external perspective view showing a state where the LED device is attached to the attaching object by the socket connector of FIG. 6A.
Figure 6C:
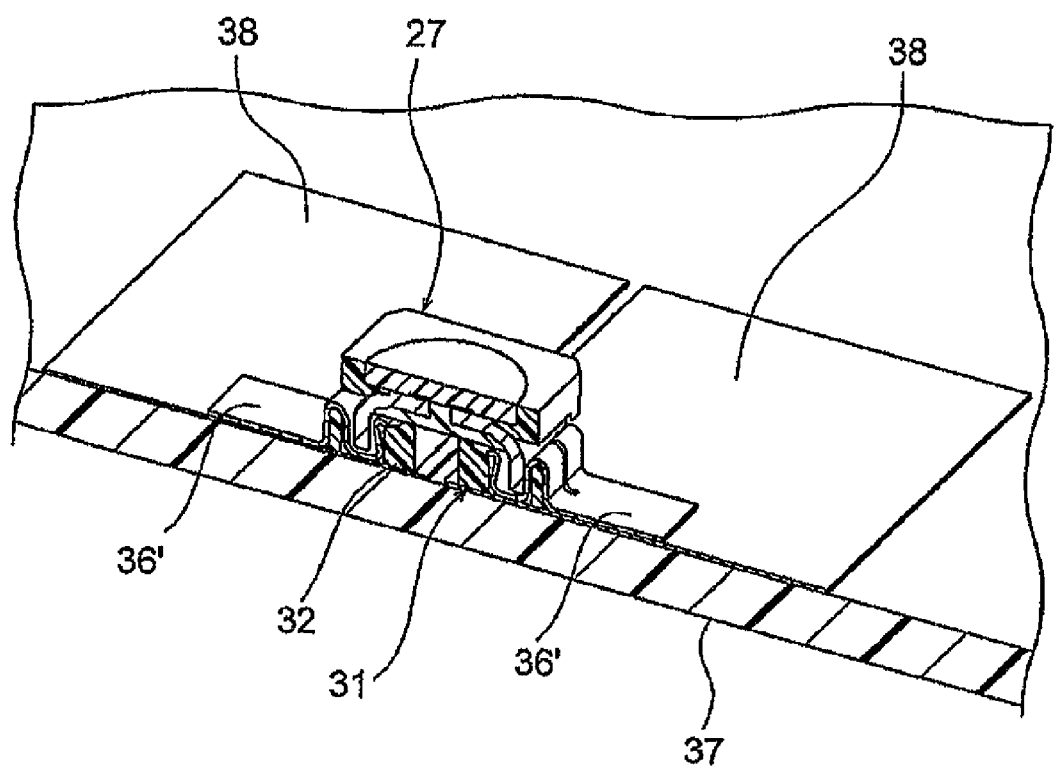
FIG. 6C is an enlarged cross-sectional view of FIG. 6B.

It is of course possible to use the above-mentioned housing 32 also in the socket connector 31 shown in FIG. 6. An example using the housing 32 is shown in FIGS. 6A to 6C.

Also in FIG. 7, connecting portions respectively provided to a plurality of metal springs 33 of a socket connector 31 are integrally formed together in advance, thereby obtaining a single connection plate 36'. Consequently, the socket connector 31 is formed without using the above-mentioned housing 32. Then, the connection plates 36' are fixed to an attaching object 37 using socket caulking 43, thereby electrically connecting the connection plates 36' to interconnections 38 on the attaching object 37.

While the description has been given above of the example in which the connection plates 36' are connected to the interconnections 38 on the attaching object 37, the connection plates 36' may alternatively be joined to electrically independent metal plates.

It is of course possible to use the above-mentioned housing 32 also in the socket connector 31 shown in FIG. 7.

Figure 8:
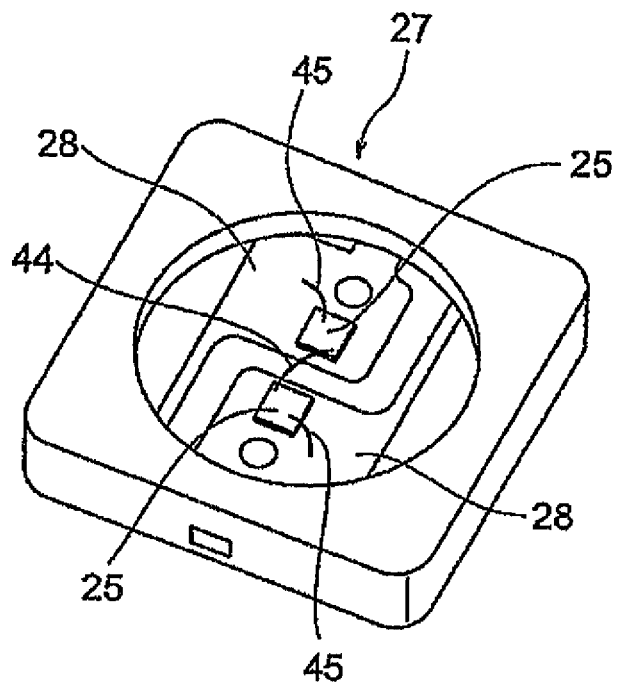
FIG. 8 is a perspective view for explaining one example of the layout and connection of LED bare chips in an LED device.
Figure 9:
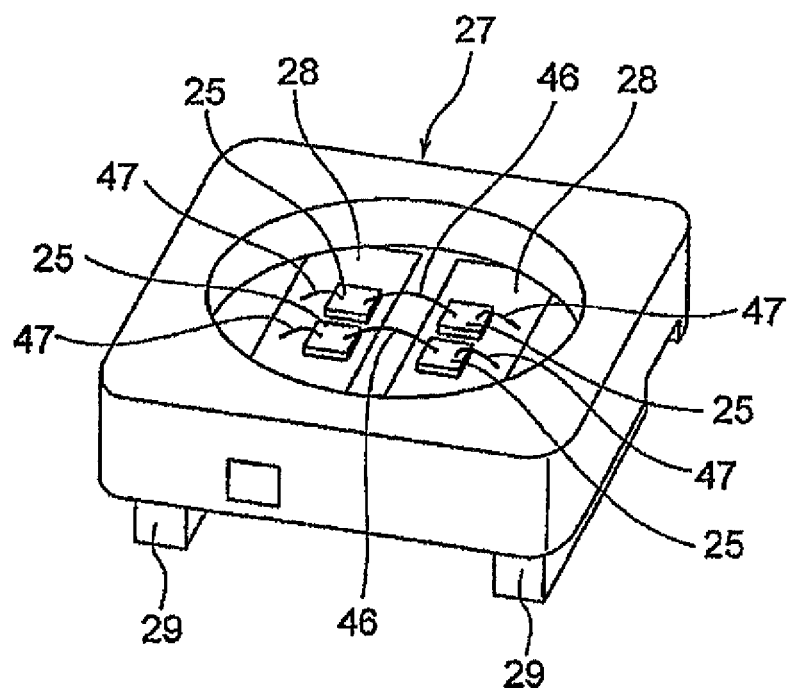
FIG. 9 is a perspective view for explaining another example of the layout and connection of LED bare chips in an LED device.
Figure 10:
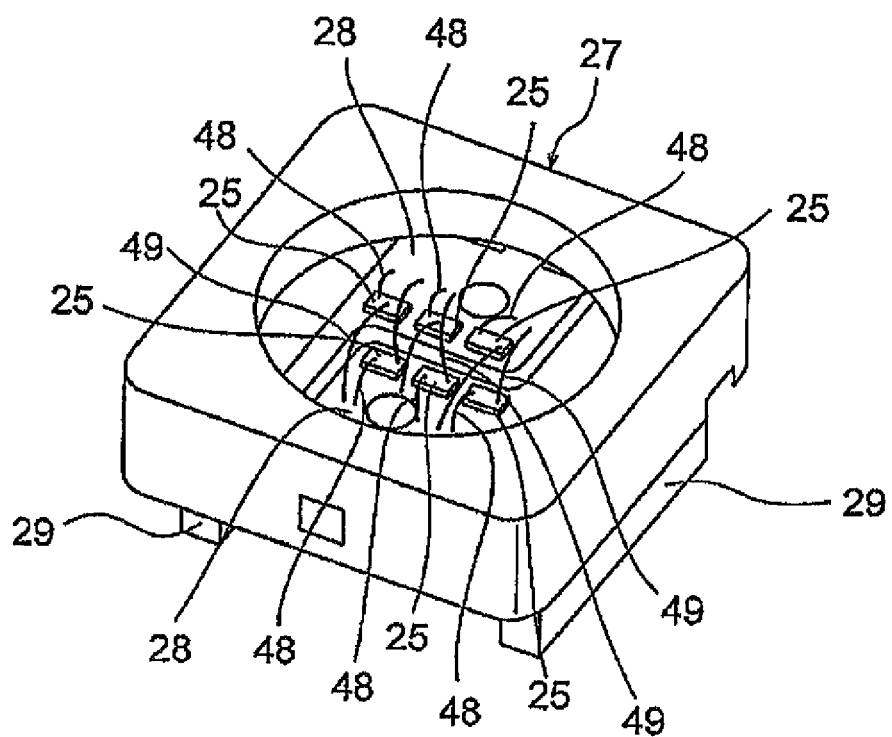
FIG. 10 is a perspective view for explaining still another example of the layout and connection of LED bare chips in an LED device.

Referring next to FIGS. 8 to 10, a description will be given of some examples of the layout and connection of bare chips 25 in an LED device 27.

In an LED device 27 of FIG. 8, two bare chips 25 are respectively mounted with respect to two metal contacts 28. The two bare chips 25 are electrically connected to each other by a conductive wire 44. Further, the two bare chips 25 are each electrically connected to the corresponding metal contact 28 by a conductive wire 45.

In an LED device 27 of FIG. 9, four bare chips 25 are mounted with respect to two metal contacts 28 such that the two bare chips 25 are mounted on each metal contact 28. The two bare chips 25 mounted on one of the metal contacts 28 and the two bare chips 25 mounted on the other of the metal contacts 28 are electrically connected to each other by conductive wires 46. Further, the four bare chips 25 are each electrically connected to the corresponding metal contact 28 by a conductive wire 47.

In an LED device 27 of FIG. 10, six bare chips 25 are mounted with respect to two metal contacts 28 such that the three bare chips 25 are mounted on each metal contact 28. The six bare chips 25 are each electrically connected to the two metal contacts 28 by conductive wires 48 and 49.

In FIG. 8, the two LED bare chips are connected in series while, in FIG. 9, the two LED bare chips are connected in series so that two series structures are arranged side by side. In FIG. 10, the six LED bare chips are connected in parallel. In this manner, the wiring configuration may be suitably determined. While the description has been given of the case where the LED device 27 has two plus and minus terminals (has two terminal portions 29), the same number of bare chips may be mounted on each contact likewise even in the case of four terminals or six terminals. The reason is that, by distributing the generated heat from the bare chips 25 in the LED device 27 equally by the number of terminal portions 29, the heat can be uniformly transmitted from the terminal portions 29 to the attaching object 37 such as a mounting board or a housing. That is, by providing the same number of bare chips 25 on each of the paired metal contacts 28, the generated heat from the bare chips 25 can be equally distributed to the terminal portions 29. In this manner, by equally distributing the generated heat from the bare chips 25 to the terminal portions 29, it is possible to prevent the localization of heat and thus to reduce the difference in stress to be generated so that the reliability is improved. Assuming that the number of terminal portions 29 of the LED device 27 is n (n≥2), the number of bare chips 25 that are mounted in the LED device 27 becomes a multiple of n.

Figure 11:
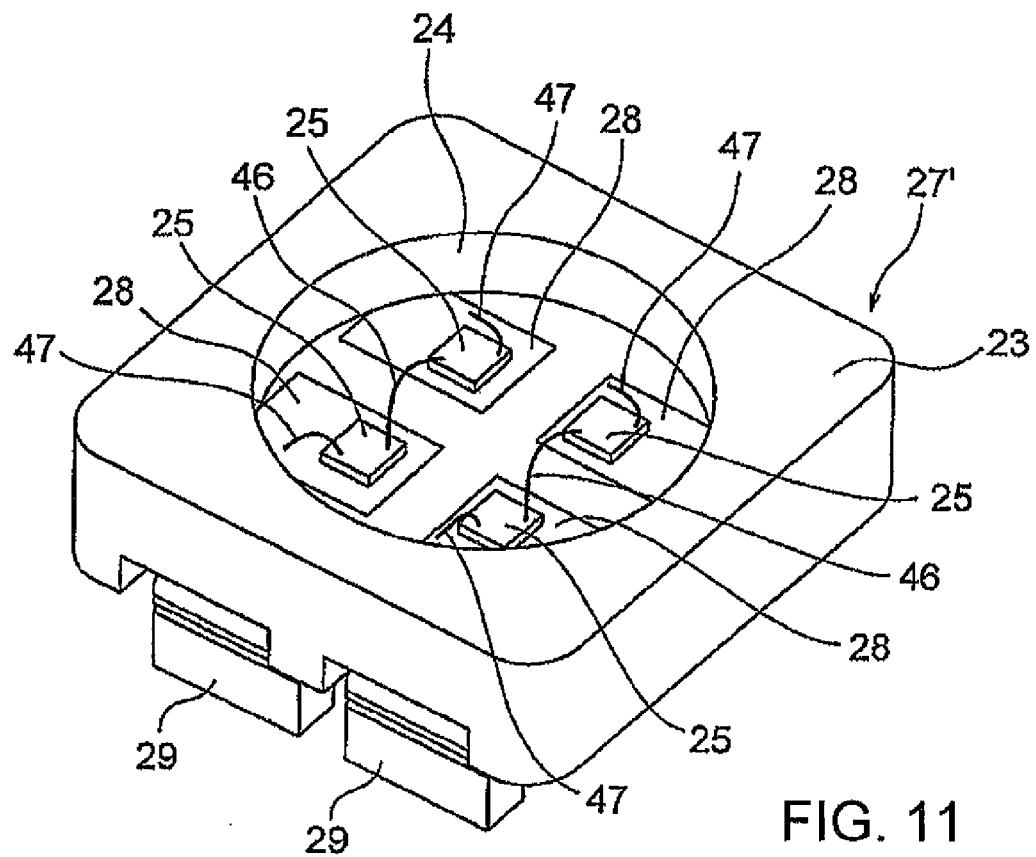
FIG. 11 is a perspective view of an LED device according to another embodiment of this invention.
Figure 12:
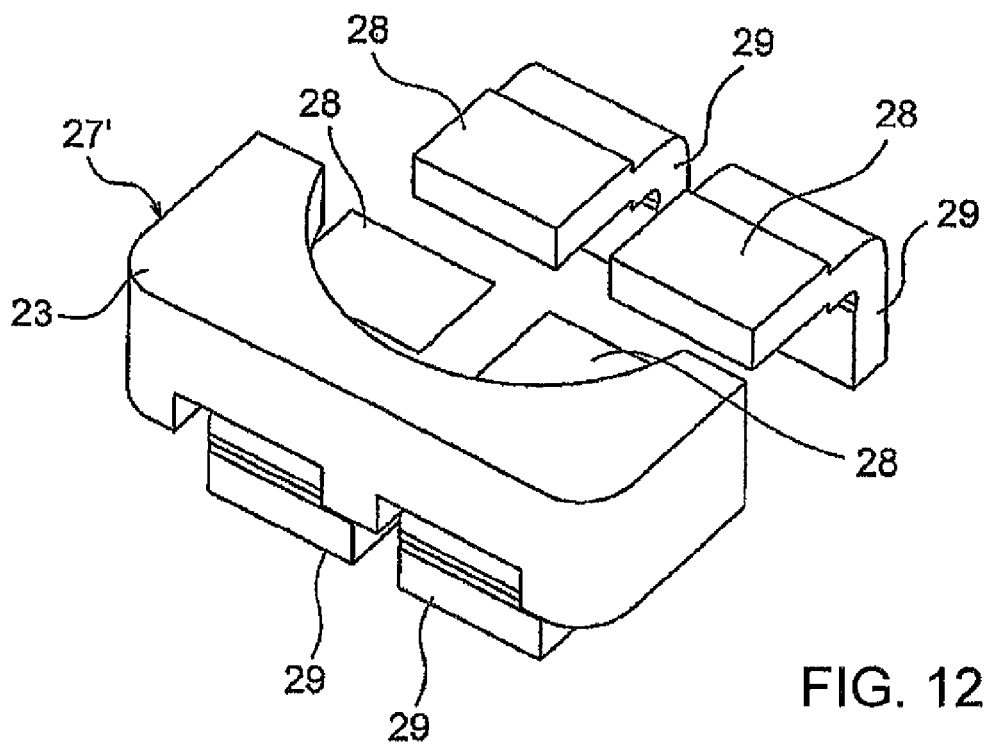
FIG. 12 is a perspective view showing only the main part of the LED device of FIG. 11 by cutting out part of it.

FIGS. 11 and 12 show an LED device 27' according to another embodiment of this invention. This LED device 27' has four terminal portions 29. Out of the four terminal portions 29, the two are minus terminals and the other two are plus terminals. That is, the single LED device 27' has the two plus terminals and the two minus terminals. In this manner, by providing the plurality of plus terminals and the plurality of minus terminals, it is possible to individually control LEDs that emit different colors of light, which is convenient for adjusting the color.

Figure 13:
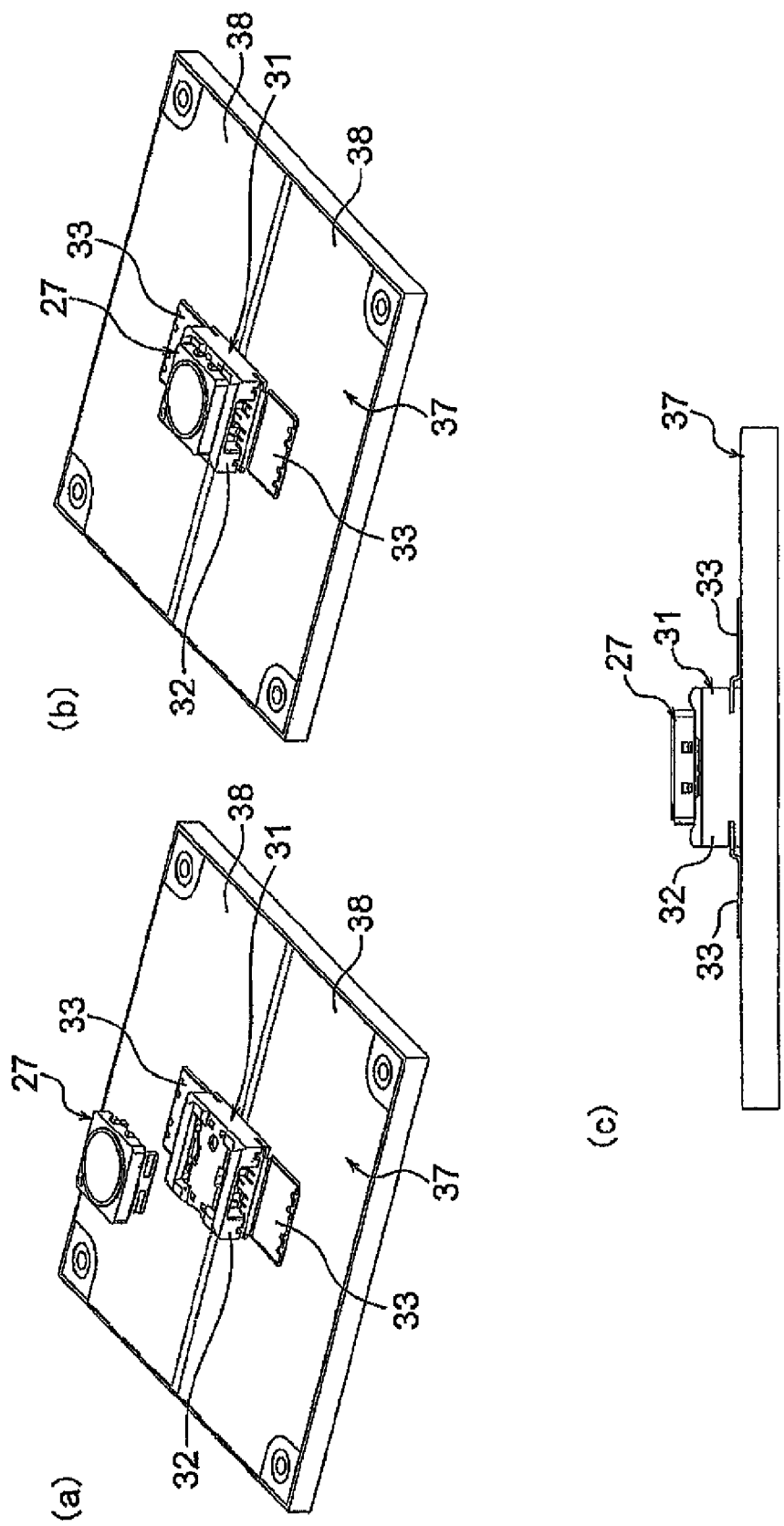
FIG. 13 shows a modification of the light-emitting apparatus, wherein (a) is a perspective view thereof in a disassembled state, (b) is a perspective view thereof in an assembled state, and (c) is a side view thereof in the assembled state.

FIG. 13 shows a modification of the light-emitting apparatus. The same reference symbols are assigned to those portions having the same functions, thereby omitting an explanation thereof.

In a socket connector 31 used in the light-emitting apparatus of FIG. 13, portions of metal springs 33 are held by a housing 32. As shown in (a), the socket connector 31 is mounted on a surface of an attaching object 37 such as a board using a mounter and the other portions of the metal springs 33 are respectively connected to two interconnections 38, which are disposed to be spaced apart from each other, of the attaching object 37 using a technique such as reflow soldering.

Then, as shown in (b) and (a), an LED device 27 is fitted to the socket connector 31. The relationship between the LED device 27 and the socket connector 31 may be the same as one of the various examples described above.

Figure 14:
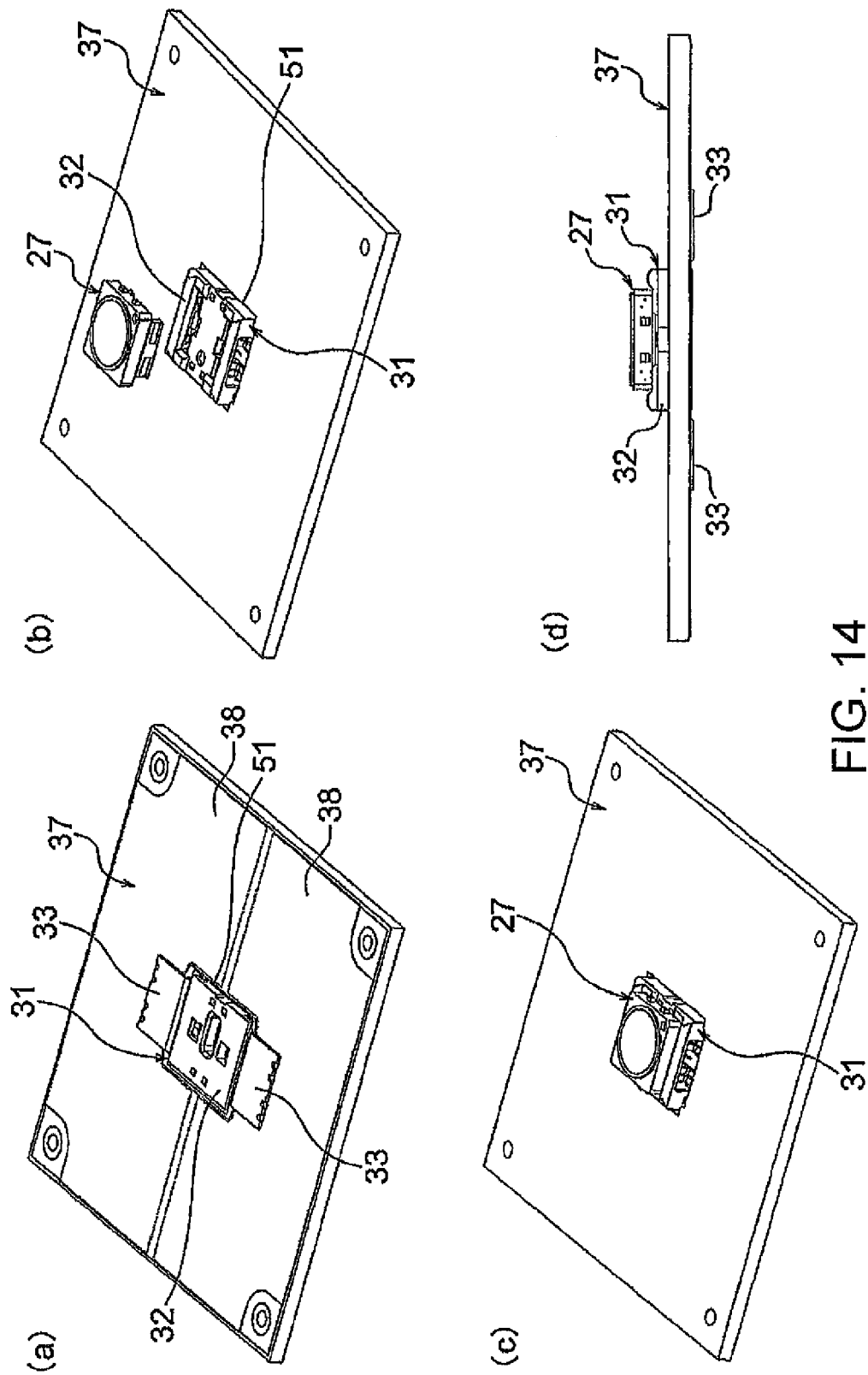
FIG. 14 shows another modification of the light-emitting apparatus, wherein (a) is a perspective view thereof under assembly from its back surface side, (b) is a perspective view thereof under assembly from its front surface side, (c) is a perspective view thereof in an assembled state from its front surface side, and (d) is a side view thereof in the assembled state.

FIG. 14 shows another modification of the light-emitting apparatus. The same reference symbols are assigned to those portions having the same functions, thereby omitting an explanation thereof.

Also in a socket connector 31 used in the light-emitting apparatus of FIG. 14, portions of metal springs 33 are held by a housing 32. A through hole 51 is formed in an attaching object 37 from its front to back. Using this through hole 51, the socket connector 31 is mounted on the attaching object 37. That is, as shown in (a), the socket connector 31 is inserted down into the through hole 51 in a posture which is upside down as compared with that in FIG. 13(a), and the other portions of the metal springs 33 are respectively connected to two interconnections 38, which are disposed to be spaced apart from each other, of the attaching object 37 using a technique such as reflow soldering.

After mounting the socket connector 31 on the attaching object 37 as described above, the attaching object 37 is turned over as shown in (b) and then an LED device 27 is fitted to the socket connector 31 as shown in (c) and (d). The relationship between the LED device 27 and the socket connector 31 may be the same as one of the various examples described above.

According to the light-emitting apparatus of FIG. 14, it is possible to reduce the dimension in a thickness direction of the attaching object 37.

Figure 15:
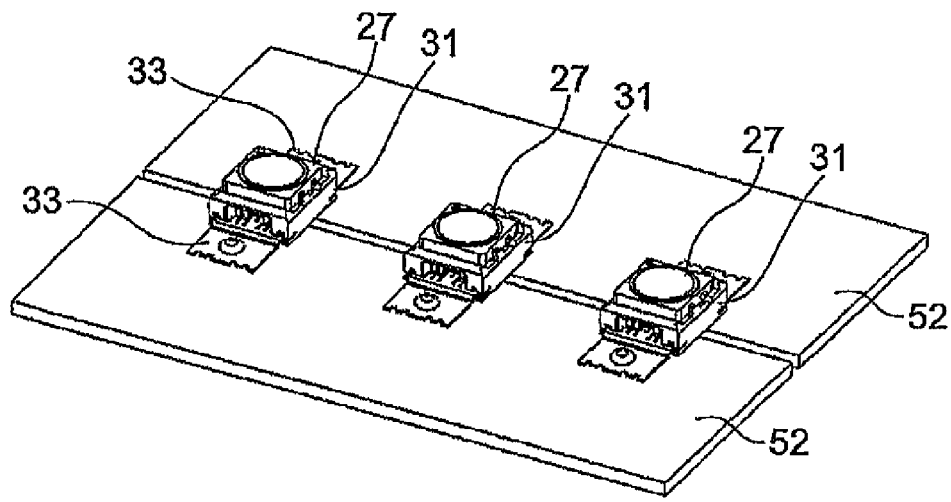
FIG. 15 is a perspective view showing still another modification of the light-emitting apparatus.

FIG. 15 shows still another modification of the light-emitting apparatus. The same reference symbols are assigned to those portions having the same functions, thereby omitting an explanation thereof.

The light-emitting apparatus of FIG. 15 uses two electrically independent metal plates 52 as attaching objects and interconnections. Between these metal plates 52, a plurality of socket connectors 31 each having an LED device 27 connected thereto are mounted in a bridging state. Further, metal springs 33 of each socket connector 31 are connected to the metal plates 52 by a suitable connection method. One example of the suitable connection method is so-called bus bar mounting.

Figure 16:
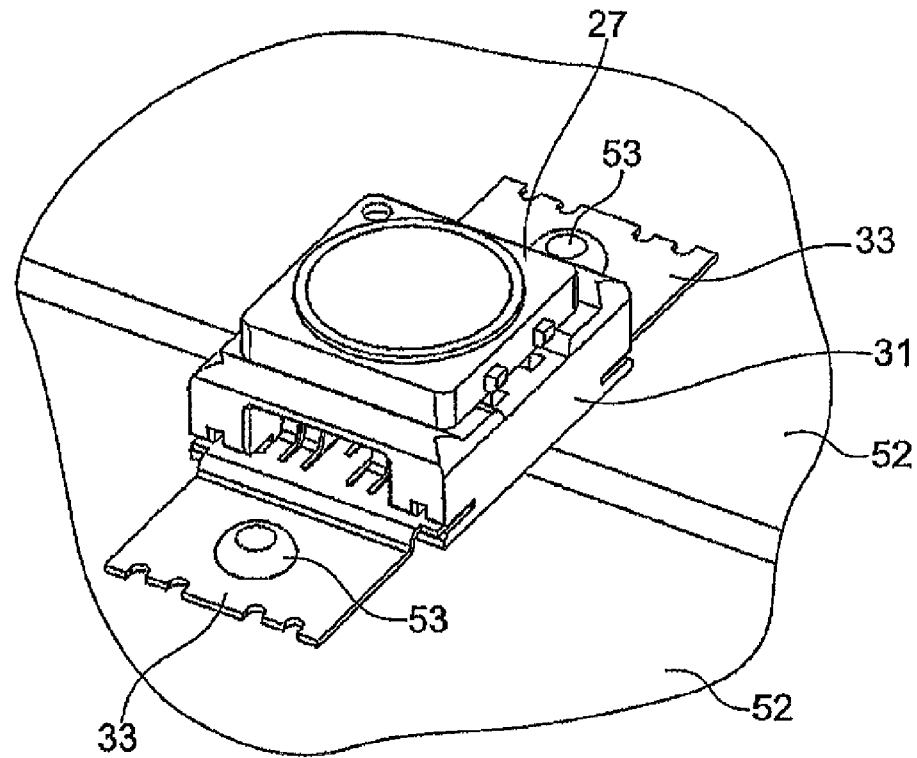
FIG. 16 is a perspective view for explaining one example of a connection method that can be used for the light-emitting apparatus of FIG. 15.
Figure 17:
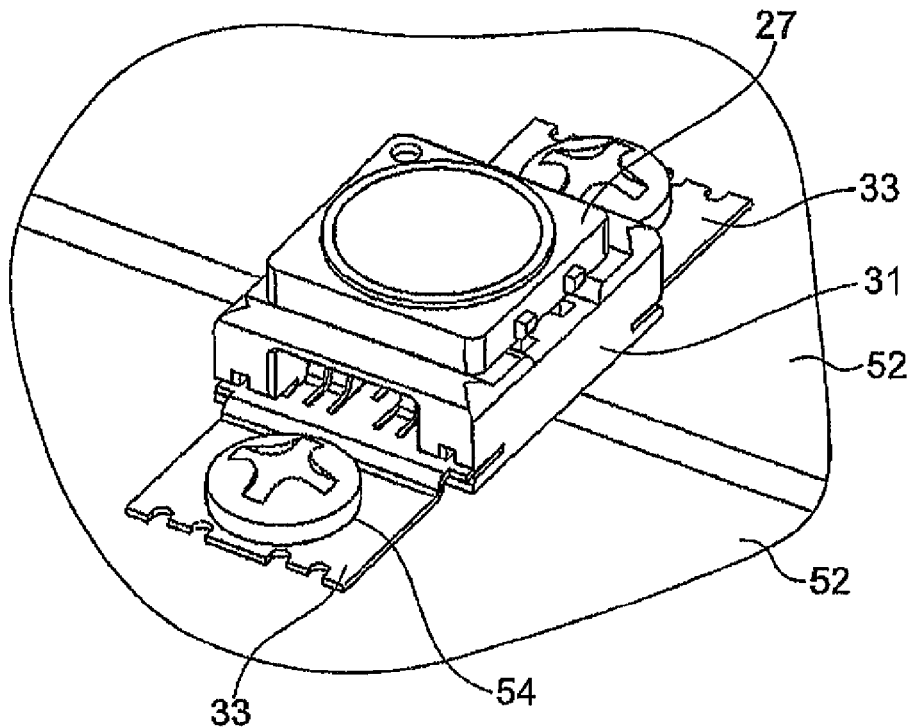
FIG. 17 is a perspective view for explaining another example of a connection method that can be used for the light-emitting apparatus of FIG. 15.
Figure 18:
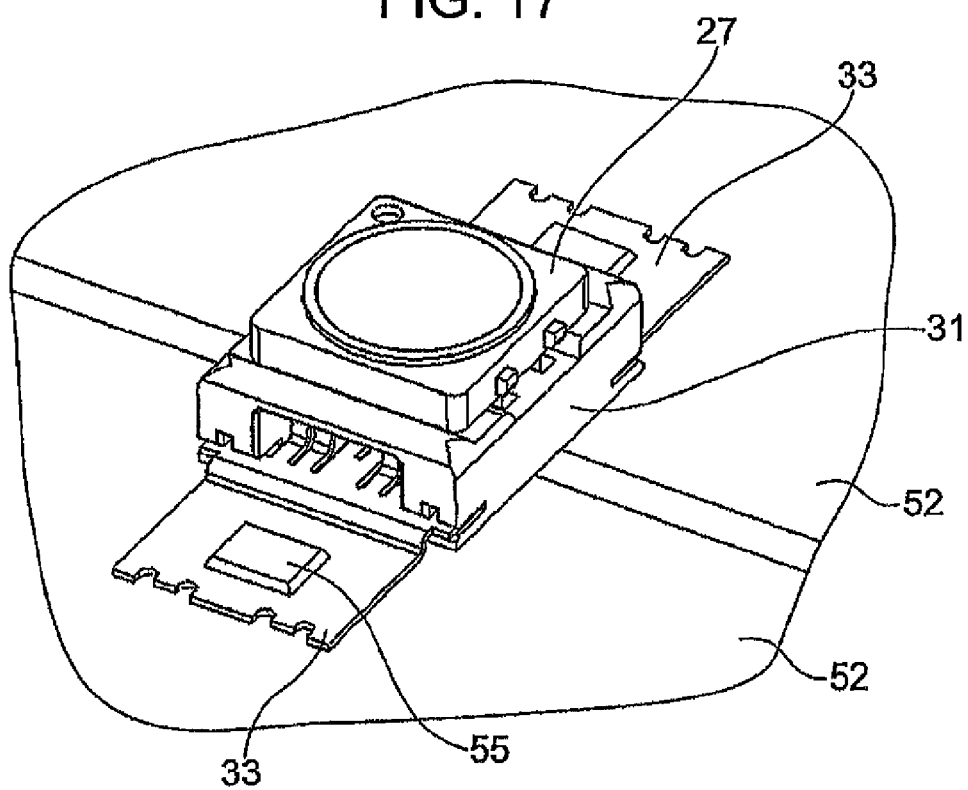
FIG. 18 is a perspective view for explaining still another example of a connection method that can be used for the light-emitting apparatus of FIG. 15.

As another example of the suitable connection method, laser welding portions 53 shown in FIG. 16, screwing portions 54 shown in FIG. 17, and caulking portions 55 shown in FIG. 18 can be used alone or in combination thereof.

Figure 19:
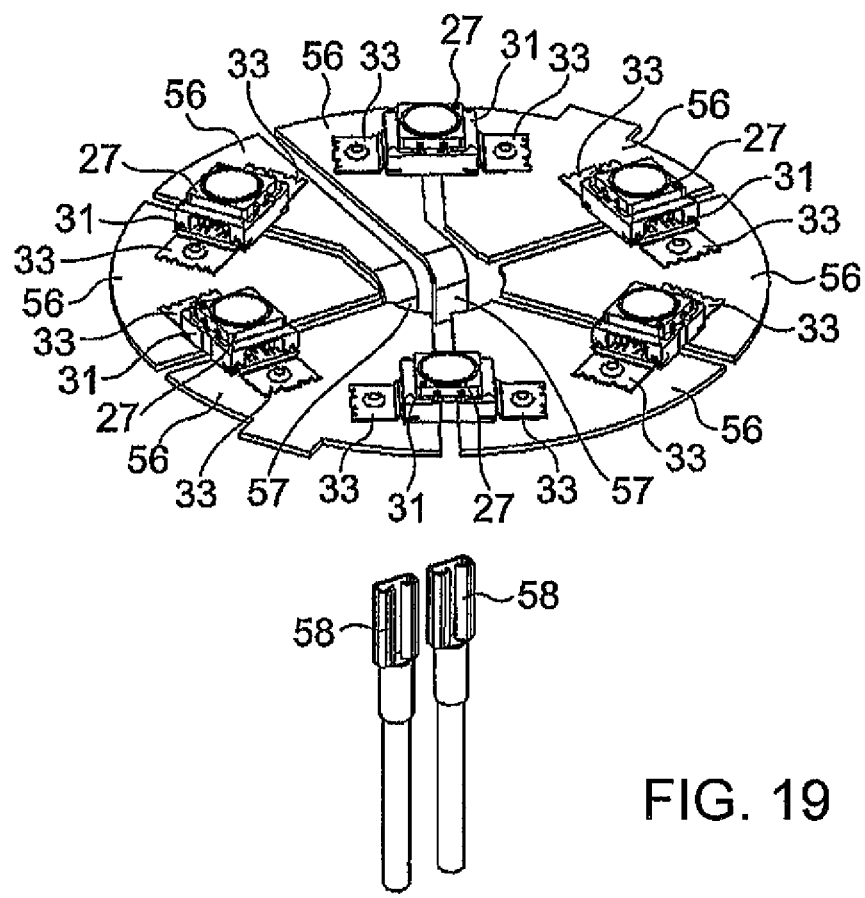
FIG. 19 is a perspective view showing still another modification of the light-emitting apparatus.

FIG. 19 shows still another modification of the light-emitting apparatus. The same reference symbols are assigned to those portions having the same functions, thereby omitting an explanation thereof.

The light-emitting apparatus of FIG. 19 uses, as attaching objects and interconnections, a plurality of, for example, seven, flat plate-shaped metal plates 56 which are formed by press working or the like and are electrically independent of each other. These metal plates 56 are disposed side by side in a circumferential direction to form a ring shape, a plurality of, for example, six, socket connectors 31 each having an LED device 27 connected thereto are mounted in a bridging state between the adjacent metal plates 56, and metal springs 33 are connected to the metal plates 56, thereby forming a series circuit. In this case, the two metal plates 56, located at both ends of the series circuit, of the seven metal plates 56 are each provided with a connecting portion 57 by bending and harness terminals 58 are fitted and connected to the connecting portions 57 so that the metal plates 56 can be fixed to the harness. The plurality of metal plates are arranged in the circumferential direction.

Figure 20:
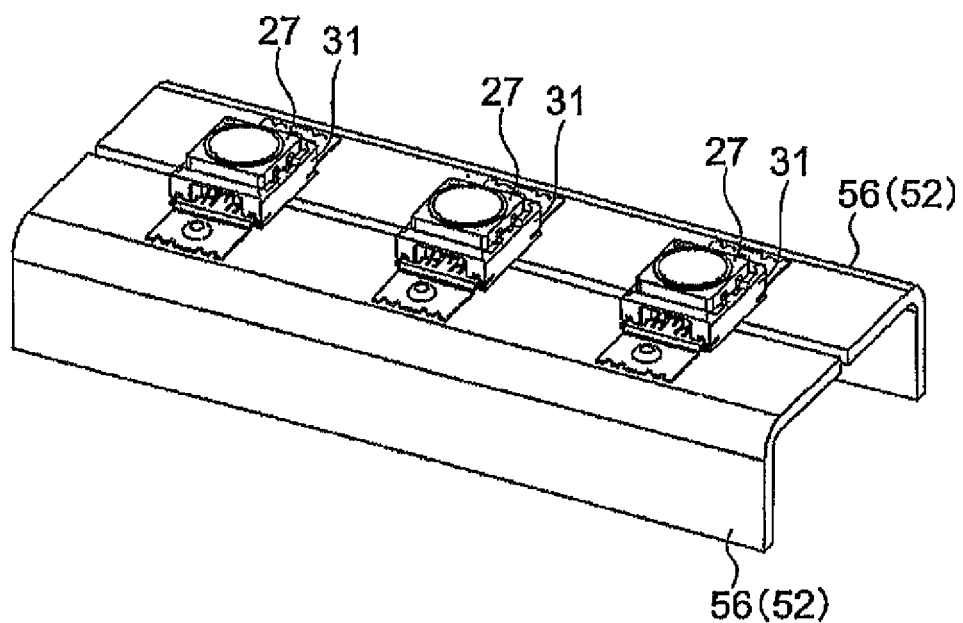
FIG. 20 is a perspective view showing still another modification of the light-emitting apparatus.

Each metal plate 56 (52) is not limited to the flat plate shape, but may be, for example, an angled member as shown in FIG. 20.

Figure 21:
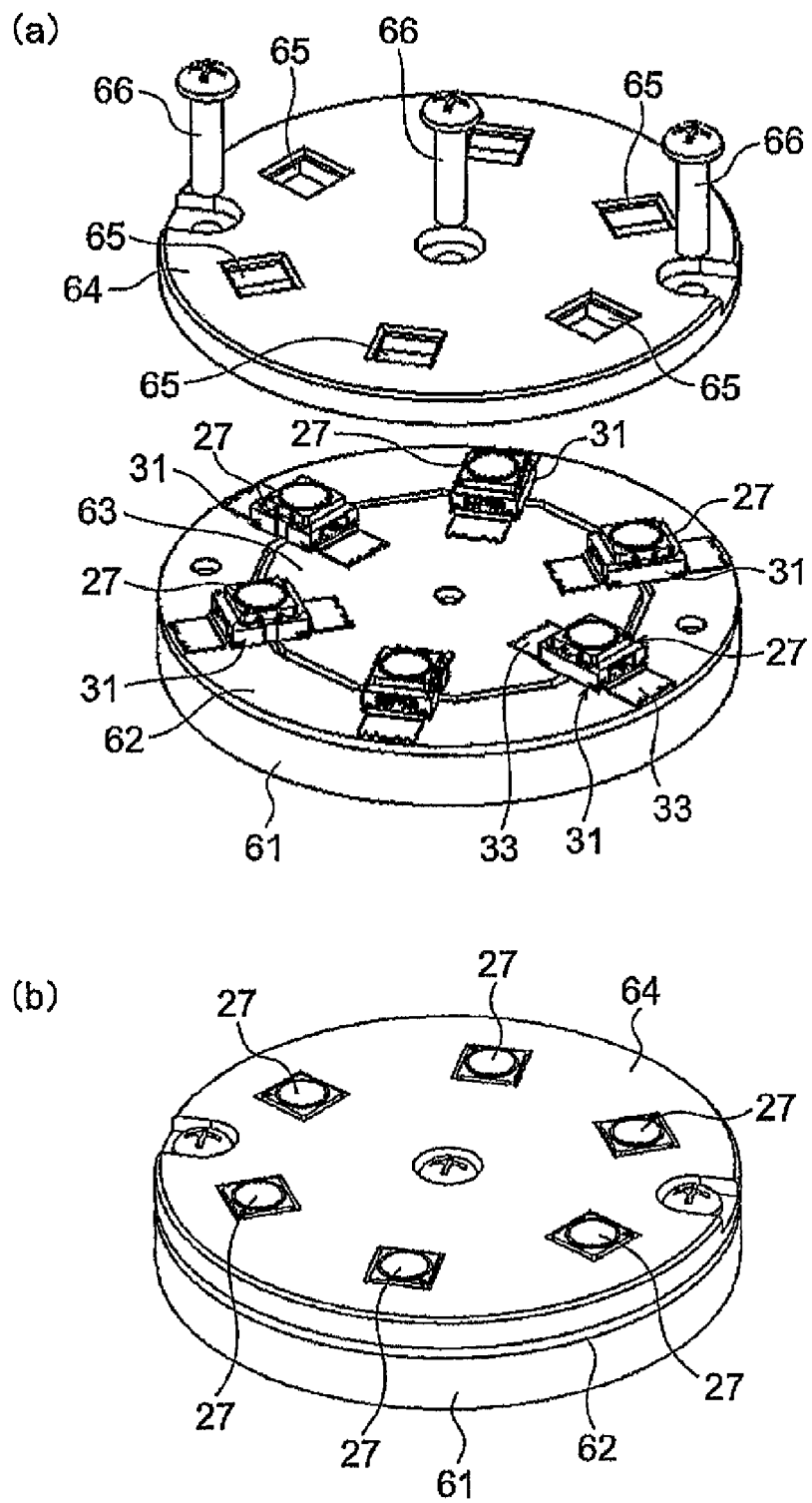
FIG. 21 shows still another modification of the light-emitting apparatus, wherein (a) is a perspective view thereof in a disassembled state and (b) is a perspective view thereof in an assembled state.

FIG. 21 shows still another modification of the light-emitting apparatus. The same reference symbols are assigned to those portions having the same functions, thereby omitting an explanation thereof.

The light-emitting apparatus of FIG. 21 comprises a disc-shaped housing 61 made of an insulator, a first ring-shaped metal plate 62 disposed on a disc-shaped surface of the housing 61, a second polygonal metal plate 63 disposed on the disc-shaped surface of the housing 61 inward of the first metal plate 62, and a disc-shaped insulating reflector 64, as a separate component, having an outer diameter equal to that of the first metal plate 62. The first and second metal plates 62 and 63 serve as interconnections and both can be formed by press working or the like. Herein, it can also be said that the first and second metal plates 62 and 63 are arranged in a radial direction.

As shown in (a), an inner peripheral face of the first metal plate 62 faces an outer peripheral face of the second metal plate 63 with a substantially uniform gap therebetween on the disc-shaped surface of the housing 61 and therefore the first and second metal plates 62 and 63 are electrically independent of each other. A plurality of, for example, six, socket connectors 31 each having an LED device 27 connected thereto are placed in a bridging state between the first and second metal plates 62 and 63. Metal springs 33 of each socket connector 31 are in contact with the first and second metal plates 62 and 63.

In (a), further, the reflector 64 is overlaid on the first and second metal plates 62 and 63. In this event, the socket connectors 31 are respectively inserted into a plurality of holes 65 formed in the reflector 64. Further, the reflector 64 is tightly fixed to the housing 61 using screw rods 66 or the like. Consequently, by the reflector 64, the metal springs 33 of the socket connectors 31 are pressed to the first and second metal plates 62 and 63 so as to be electrically connected thereto and the positions of the socket connectors 31 are fixed.

In this manner, the light-emitting apparatus shown in (b) is obtained.

Figure 22:
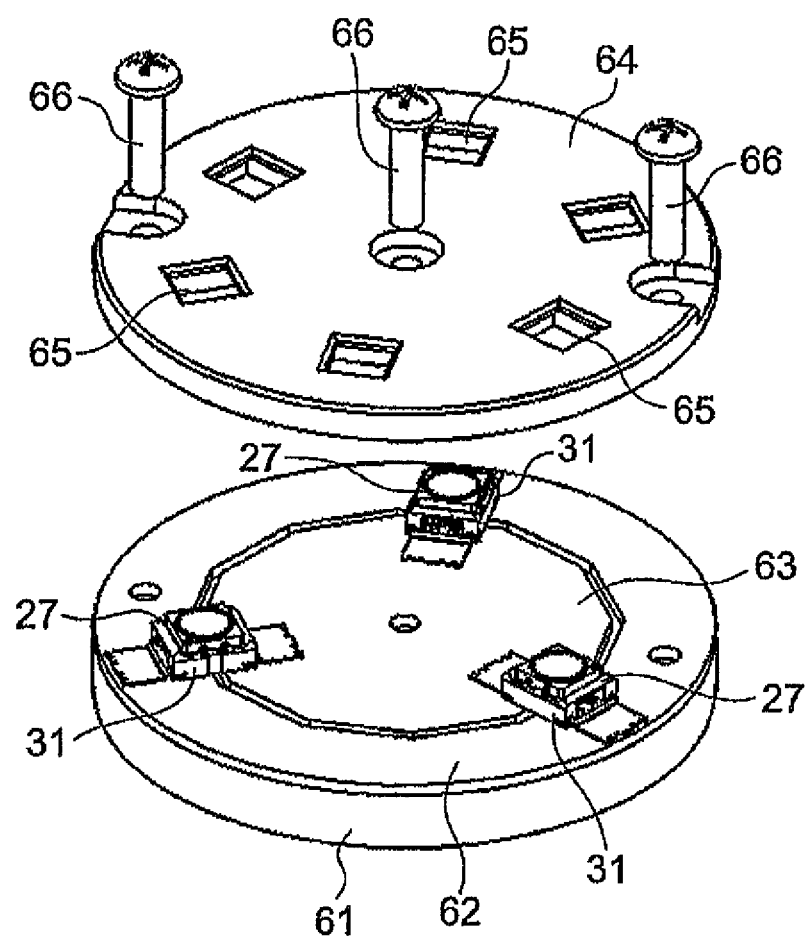
FIG. 22 is a perspective view of still another modification of the light-emitting apparatus in a disassembled state.

In FIG. 21, the six LED devices 27 and the six socket connectors 31 are used. However, the number of them may be suitably changed as in FIG. 22 which shows a case of three.

Figure 23:
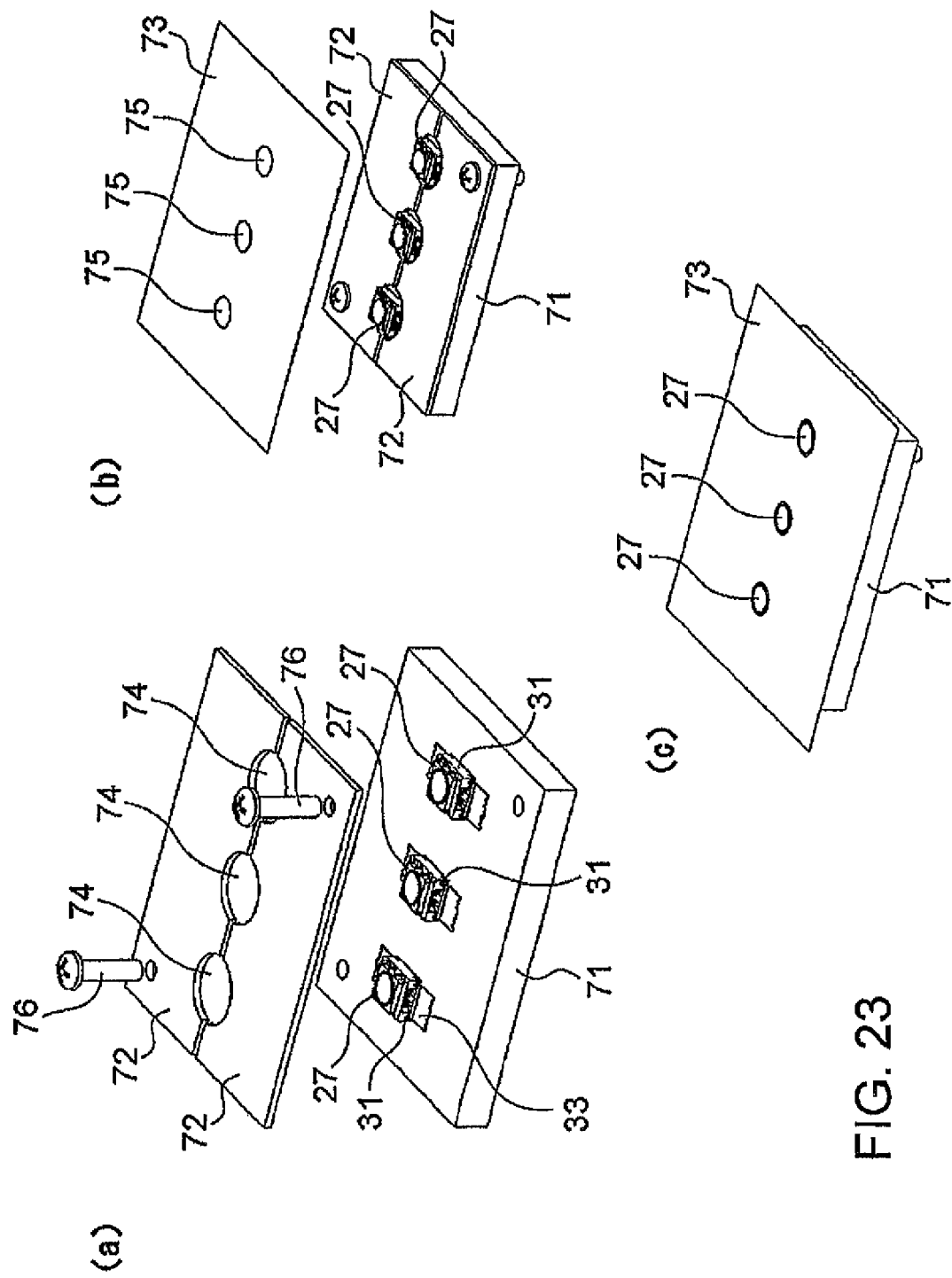
FIG. 23 shows still another modification of the light-emitting apparatus, wherein (a) is a perspective view thereof under assembly, (b) is a perspective view thereof in a state where the assembly has been further advanced, and (c) is a perspective view thereof in an assembly completed state.
Figure 24:
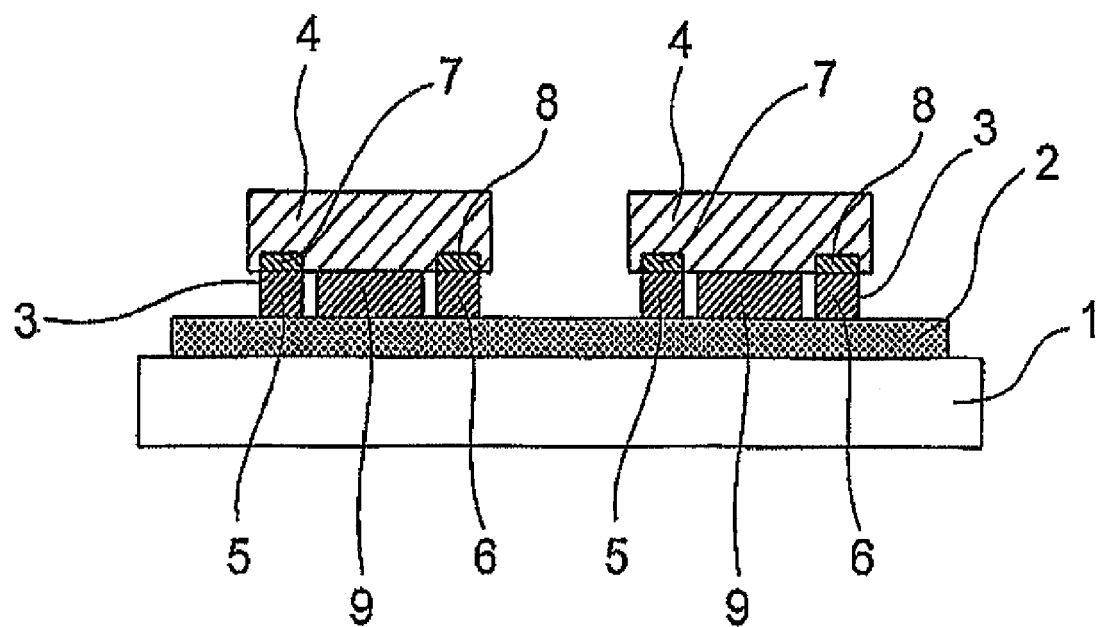
FIG. 24 is a cross-sectional view for explaining an LED illumination system disclosed in Patent Document 1 (JP-A-2004-199896).

FIG. 23 shows still another modification of the light-emitting apparatus. The same reference symbols are assigned to those portions having the same functions, thereby omitting an explanation thereof.

The light-emitting apparatus of FIG. 23 comprises a rectangular plate-shaped housing 71 made of an insulator, two metal plates 72 adjacently disposed on a rectangular surface of the housing 71, and an insulating reflection sheet 73 covering the metal plates 72. The metal plates 72 can be formed by press working or the like and respectively have a plurality of semicircular recesses on their mutually facing sides. These semicircular recesses cooperatively form a plurality of substantially circular holes 74 when the two metal plates 72 are disposed adjacent to each other. The reflection sheet 73 has a plurality of small holes 75 which are in one-to-one correspondence with the holes 74.

As shown in (a), a plurality of socket connectors 31 each having an LED device 27 connected thereto are disposed so as to be spaced apart from each other on the rectangular surface of the housing 71. Then, the two metal plates 72 are adjacently disposed with a gap therebetween on the rectangular surface of the housing 71. Therefore, the two metal plates 72 are electrically independent of each other and are used as attaching objects and interconnections. Further, the metal plates 72 are tightly fixed to the housing 71 using screw rods 76 or the like. Consequently, the metal plates 72 are pressed to metal springs 33 of the socket connectors 31 so as to be electrically connected thereto and so as to fix the positions of the socket connectors 31.

Further, as shown in (b), the reflection sheet 73 is disposed on the metal plates 72. In this event, the LED devices 27 are respectively inserted into the small holes 75 of the reflection sheets 73. In this manner, the light-emitting apparatus shown in (c) is obtained. According to this light-emitting apparatus, since the reflection sheet 73 is used, it is possible to effectively use the light of the LED devices 27.

Part or the whole of the above-mentioned embodiments can also be described as the following supplementary notes but is not limited thereto.

(Supplementary Note 1)

An LED device characterized in that an LED bare chip 25 is mounted directly on a metal contact 28 and power supply to the bare chip 25 and heat conduction from the bare chip 25 are carried out through the metal contact 28.

(Supplementary Note 2)

The LED device according to supplementary note 1, characterized by comprising a pair of metal contacts 28, wherein the bare chip 25 is provided, in equal number, on each of the pair of metal contacts 28.

(Supplementary Note 3)

The LED device according to supplementary note 1 or 2, characterized by comprising a device body 23 made of plastic and insert-molded with the metal contact 28, wherein the metal contact 28 has a terminal portion 29 protruding outward from the device body 23.

(Supplementary Note 4)

A method of manufacturing the LED device according to any one of supplementary notes 1 to 3, characterized by preparing a lead frame 21 formed with the pair of metal contacts 28, forming a device body by insert-molding the pair of metal contacts 28 with the plastic, mounting the bare chips 25 on the pair of metal contacts 28 to form the LED device on the lead frame 21, and then cutting the metal contacts 28 to separate the LED device from the lead frame 21.

(Supplementary Note 5)

A light-emitting apparatus characterized by comprising the LED device according to any one of supplementary notes 1 to 3 and a connector 31 adapted to be attached to an attaching object 37 and capable of fitting the metal contacts 28, wherein power is supplied to the bare chips 25 from the attaching object 37 through the connector 31 and the metal contacts 28 and heat of the bare chips is transmitted to the attaching object 37 through the metal contacts 28 and the connector 31 to carry out heat dissipation.

(Supplementary Note 6)

The light-emitting apparatus according to supplementary note 5, characterized by further comprising the attaching object 37, wherein a plurality of interconnections 38 are formed on a surface of the attaching object 37, the connector 31 is disposed in a bridging state between the interconnections 38, and the metal contacts 28 are connected to the interconnections 38.

(Supplementary Note 7)

The light-emitting apparatus according to supplementary note 5, characterized by further comprising, as the attaching object 37, a plurality of metal plates which are disposed adjacent to each other and are electrically independent of each other, wherein the connector 31 is disposed in a bridging state between the adjacent metal plates and the metal contacts 28 are connected to the metal plates.

(Supplementary Note 8)

The light-emitting apparatus according to supplementary note 7, characterized in that the plurality of metal plates are arranged parallel to each other.

(Supplementary Note 9)

The light-emitting apparatus according to supplementary note 7, characterized in that the plurality of metal plates are arranged in a circumferential direction.

(Supplementary Note 10)

The light-emitting apparatus according to supplementary note 7, characterized in that the plurality of metal plates are arranged in a radial direction.

(Supplementary Note 11)

The light-emitting apparatus according to any one of supplementary notes 0 to 10, characterized by further comprising a separate component that fixes the connector 31 to the attaching object 37.

(Supplementary Note 12)

The light-emitting apparatus according to supplementary note 11, characterized in that the separate component is insulating.

While this invention has been described with reference to the embodiments, this invention is not limited thereto. Various changes that can be understood by those skilled in the art can be made to the structures and details of this invention within the scope of this invention.

This application claims the benefit of priority from Japanese Patent Application No. 2010-18719, filed on Jan. 29, 2010, the disclosure of which is incorporated herein in its entirety by reference.

INDUSTRIAL APPLICABILITY

This invention is applicable to general illumination, streetlights, car backlights, and so on.

DESCRIPTION OF SYMBOLS

1 substrate
2 heat transfer layer
3 conductive layer
4 LED chip
5, 6 terminals of conductive layer
7, 8 electrodes of LED chip
9 heat contact portion of conductive layer
21 lead frame
22 metal piece
23 device body
24 recess 25 LED bare chip (light-emitting element)
27 LED device
27' LED device
28 metal contact
29 terminal portion
31 socket connector (connector)
32 housing
33 metal spring
34 elongated hole
35 contact portion
36 connecting portion
36' connection plate
37 attaching object
38 interconnection
41 screw
42 socket welding
43 socket caulking
44 to 49 conductive wires
51 through hole
52 metal plate
53 laser welding portion
54 screwing portion
55 caulking portion
56 metal plate
57 connecting portion
58 harness terminal
61 housing
62 first metal plate
63 second metal plate
64 reflector
65 hole
66 screw rod
71 housing
72 metal plate
73 reflection sheet
74 hole

The invention claimed is:

1. An LED device to be connected to a socket connector, comprising:
a device body made of plastic and having a first surface and a second surface opposite to the first surface;
a plurality of metal contacts insert-molded in the device body and each having a first end portion placed on the first surface and a second end portion opposite to the first end portion; and
a plurality of LED bare chips mounted directly on the first end portions of the metal contacts, respectively,
wherein the second end portions of the metal contacts protrude outward of the device body from the second surface, thereby forming terminal portions each of which has a plate shape perpendicular to the second surface,
wherein each of the terminal portions extends lengthily along the second surface to fit snugly with an elongated socket of the socket connector, and
wherein power supply to the LED bare chips and heat radiation from the LED bare chips are carried out through the metal contacts.

2. The LED device according to claim 1, wherein the LED bare chips are provided, in equal number, on the metal contacts.

3. A method of manufacturing the LED device according to claim 1, the method comprising steps of:
preparing a lead frame formed with a pair of metal contacts,
forming a device body by insert-molding the pair of metal contacts with the plastic, the device body having a first surface and a second surface opposite to the first surface, the metal contacts having a first end portion on the first surface and a second end portion opposite to the first end portion, the second end portion protruding outward from the second surface to provide a terminal portion, the terminal portion being adapted to be inserted into a socket connector,
mounting the LED bare chip on the pair of metal contacts to form the LED device on the lead frame, and
then cutting the metal contacts to separate the LED device from the lead frame.

4. A light-emitting apparatus comprising:
the LED device according to claim 1; and
a connector formed to fit the metal contacts included in the LED device,
wherein, when the connector is fitted to the metal contact, power is supplied to the LED bare chip through the connector and the metal contacts and heat of the LED bare chip is transmitted through the metal contacts and the connector to carry out heat dissipation.

5. The light-emitting apparatus according to claim 4, further comprising:
an attaching object to which the connector is attached, and
a plurality of interconnections formed on a surface of the attaching object,
wherein the connector is disposed in a bridging state between the interconnections, and the metal contacts are connected to the interconnections.

6. The light-emitting apparatus according to claim 4, further comprising:
an attaching object to which the connector is attached, and
a plurality of metal plates which are disposed adjacent to each other and are electrically independent of each other,
wherein the connector is disposed in a bridging state between the adjacent metal plates and the metal contacts are connected to the metal plates.

7. The light-emitting apparatus according to claim 6, wherein the plurality of metal plates are arranged parallel to each other.

8. The light-emitting apparatus according to claim 6, wherein the plurality of metal plates are arranged in a circumferential direction.

9. The light-emitting apparatus according to claim 6, wherein the plurality of metal plates are arranged in a radial direction.

10. The light-emitting apparatus according to claim 5, further comprising a separate component that fixes the connector to the attaching object.

11. The light-emitting apparatus according to claim 10, wherein the separate component is insulating.

12. The light-emitting apparatus according to claim 6, further comprising a separate component that fixes the connector to the attaching object.

13. The light-emitting apparatus according to claim 12, wherein the separate component is insulating.

14. The LED device according to claim 1, further comprising a plurality of conductive wires electrically connecting the metal contacts to the LED bare chips mounted on the metal contacts, respectively.

15. The LED device according to claim 14, further comprising an additional conductive wire, wherein the metal contacts are two, the LED bare chips being two and electrically connected to each other by the additional conductive wire.

16. The LED device according to claim 14, further comprising two additional conductive wires, wherein. the LED bare chips are four, the additional conductive wires each electrically connecting between. the LED bare chips mounted on different ones of the metal contacts.

17. The LED device according to claim 14, further comprising an additional conductive wire, wherein the metal contacts are two, the LED bare chip mounted on one of the metal contacts being electrically connected to another of the metal contacts by the additional conductive wire.

* * * * *